(12) United States Patent
Cardona et al.

(10) Patent No.: US 12,199,584 B2
(45) Date of Patent: Jan. 14, 2025

(54) TRANSVERSELY-EXCITED FILM BULK ACOUSTIC RESONATOR FABRICATION USING WAFER-TO-WAFER BONDING

(71) Applicant: Murata Manufacturing Co., Ltd., Nagaokakyo (JP)

(72) Inventors: Albert Cardona, Santa Barbara, CA (US); Andrew Kay, Provo, UT (US); Chris O'Brien, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 478 days.

(21) Appl. No.: 17/546,668

(22) Filed: Dec. 9, 2021

(65) Prior Publication Data
US 2022/0337210 A1 Oct. 20, 2022

Related U.S. Application Data

(60) Provisional application No. 63/175,927, filed on Apr. 16, 2021.

(51) Int. Cl.
*H03H 3/02* (2006.01)
*H03H 9/02* (2006.01)
(Continued)

(52) U.S. Cl.
CPC .......... *H03H 3/02* (2013.01); *H03H 9/02015* (2013.01); *H03H 9/02157* (2013.01);
(Continued)

(58) Field of Classification Search
CPC .. H03H 3/02; H03H 9/02015; H03H 9/02157; H03H 9/02228; H03H 9/205; H03H 9/568; H03H 2003/021
See application file for complete search history.

(56) References Cited

U.S. PATENT DOCUMENTS 5,274,345 A 12/1993 Gau
5,446,330 A 8/1995 Eda et al.
(Continued)

FOREIGN PATENT DOCUMENTS

WO 2016017104 2/2016
WO 2018003273 1/2018

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Aneeta Yodichkas
*Assistant Examiner* — Jose K Abraham
(74) *Attorney, Agent, or Firm* — ArentFox Schiff LLP

(57) ABSTRACT

An acoustic resonator device is formed using a wafer-to-wafer bonding process by etching recesses into a first surface of a piezoelectric substrate, a depth of the recesses greater than a target piezoelectric membrane thickness; then wafer-to-wafer bonding the first surface of the piezoelectric substrate to a handle wafer using a releasable bonding method. The piezoelectric substrate is then thinned to the target piezoelectric membrane thickness to form a piezoelectric plate and at least one conductor pattern is formed on the thinned piezoelectric plate. The side of the thinned piezoelectric plate having the conductor pattern is bonded to a carrier wafer using a metal-to-metal wafer bonding process and the handle wafer is removed.

16 Claims, 8 Drawing Sheets

(51) Int. Cl.
*H03H 9/205* (2006.01)
*H03H 9/56* (2006.01)

(52) U.S. Cl.
CPC ........ *H03H 9/02228* (2013.01); *H03H 9/205* (2013.01); *H03H 9/568* (2013.01); *H03H 2003/021* (2013.01)

(56) References Cited

U.S. PATENT DOCUMENTS

| | | | |
|---|---|---|---|
| 5,552,655 A | 9/1996 | Stokes et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0020279 A1* | 1/2013 | Lee ................. B81C 1/00476 216/13 |
| 2013/0127551 A1 | 5/2013 | Yamanaka |
| 2013/0234805 A1* | 9/2013 | Takahashi ............ H10N 30/87 29/25.35 |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182007 A1* | 6/2016 | Bhattacharjee .......... H03H 3/02 29/25.35 |
| 2016/0182008 A1* | 6/2016 | Bhattacharjee .... H03H 9/02275 29/25.35 |
| 2016/0182009 A1 | 6/2016 | Bhattacharjee |
| 2016/0363609 A1* | 12/2016 | Wygant ................. B81B 7/007 |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |

(56) References Cited

U.S. PATENT DOCUMENTS

| | | |
|---|---|---|
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0069526 A1 | 3/2018 | Yamashita |
| 2018/0123016 A1 | 5/2018 | Gong |
| 2018/0191322 A1 | 7/2018 | Chang et al. |
| 2018/0278227 A1* | 9/2018 | Hurwitz ............... H03H 9/581 |
| 2018/0299303 A1* | 10/2018 | Van Der Wiel ......... G01F 15/14 |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner et al. |
| 2021/0013859 A1 | 1/2021 | Turner et al. |
| 2021/0328574 A1 | 10/2021 | Garcia |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) Jan. 2015.

\* cited by examiner

TRANSVERSELY-EXCITED FILM BULK ACOUSTIC RESONATOR FABRICATION USING WAFER-TO-WAFER BONDING

RELATED APPLICATION INFORMATION

This patent claims priority to co-pending U.S. provisional patent application No. 63/175,927, titled METHOD FOR XBAR FABRICATION USING WAFER-TO-WAFER BONDING, filed Apr. 16, 2021.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 1300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
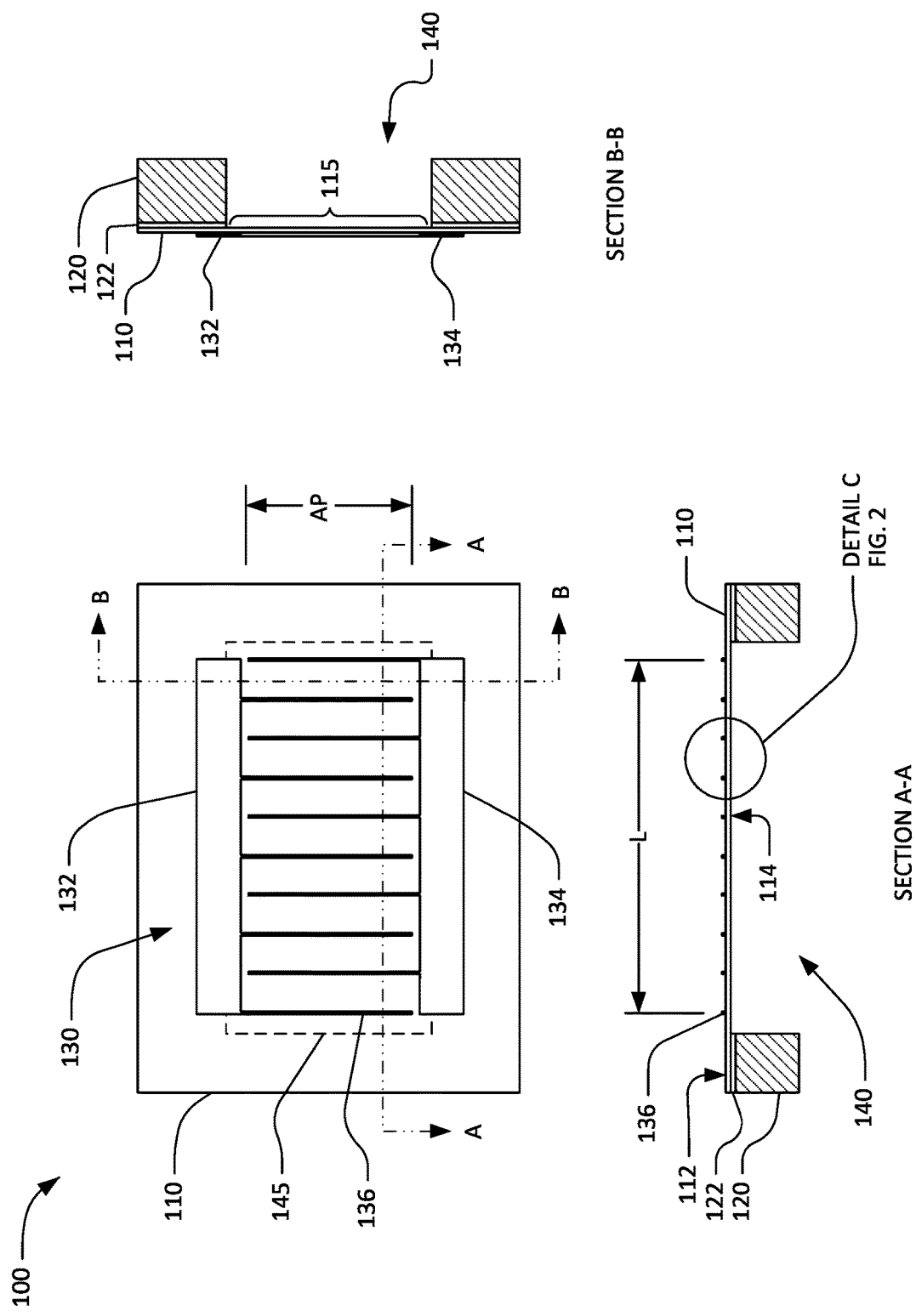
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on a diaphragm or membrane. Contact pads can be formed at selected locations over the surface of the substrate to provide electrical connections between the IDT and contact bumps to be attached to or formed on the contact pads.

XBAR fabrication processes may be divided into two broad categories known as "the front-side etch option" and the "backside etch option". With the front-side etch option, the piezoelectric plate is attached to a substrate and the active portion of the piezoelectric plate floats over a cavity (the "swimming pool") formed by etching away a tub (e.g., a thickness of an area like a bathtub) of the sacrificial material using an etchant introduced through holes in the piezoelectric plate. With the backside etch option, the piezoelectric plate is attached to a substrate and the active portion of the piezoelectric plate floats over a void etched completely through an area of the substrate and the sacrificial tub from the back side (i.e., the side opposite the piezoelectric plate). The void forms a cavity under the plate.

The following describes improved XBAR resonators, filters and fabrication techniques for XBAR resonators that are fabricated using wafer-to-wafer bonding, such as by mounting and thinning a piezoelectric substrate to form a thinned piezoelectric plate for a wafer-to-wafer bonding process that allows a frontside membrane release of the plate from a substrate when forming a cavity under the plate. This can be done by etching recesses into a first surface of a piezoelectric substrate to a depth greater than a target piezoelectric membrane thickness, bonding the first surface of the piezoelectric substrate to a handle wafer using a releasable bonding method, and then thinning the piezoelectric substrate to the target piezoelectric membrane thickness. A conductor pattern is formed on the thinned piezoelectric plate and the side of the plate having the conductor pattern is bonded to a carrier wafer using a metal-to-metal wafer bonding process. The handle wafer is removed so the thinned plate can be bonded to a substrate and a cavity formed under the plate by etching through the recesses.

These improvements avoid the backside etch options or backside membrane release (BSMR) methods that typically use a deep reactive ion etching (DRIE) technique to remove the Si substrate underneath a piezoelectric plate and the etching time increases with Si substrate thickness. Instead, the technology herein use a frontside membrane release (FSMR) etch processing which takes less etchant and time. Also, other FSMR techniques use pre-patterned Si substrates with air cavities below the plate and then require frontside device fabrication of conductor layers on thin plates which poses a high risk due to the fragility of the thin plate as the frontside device fabrication can crack and/or damage the thin plate. The technology herein uses an thinning approach that mitigates the cracking risk by providing the underlying support structure of a handle wafer bonded to the plate during the device fabrication. Thus, the frontside processing to form conductor layers and dielectric layers herein will not crack and/or damage the thin plate because of the support to the plate by the handle wafer, instead of the plate being suspended over air of a cavity.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
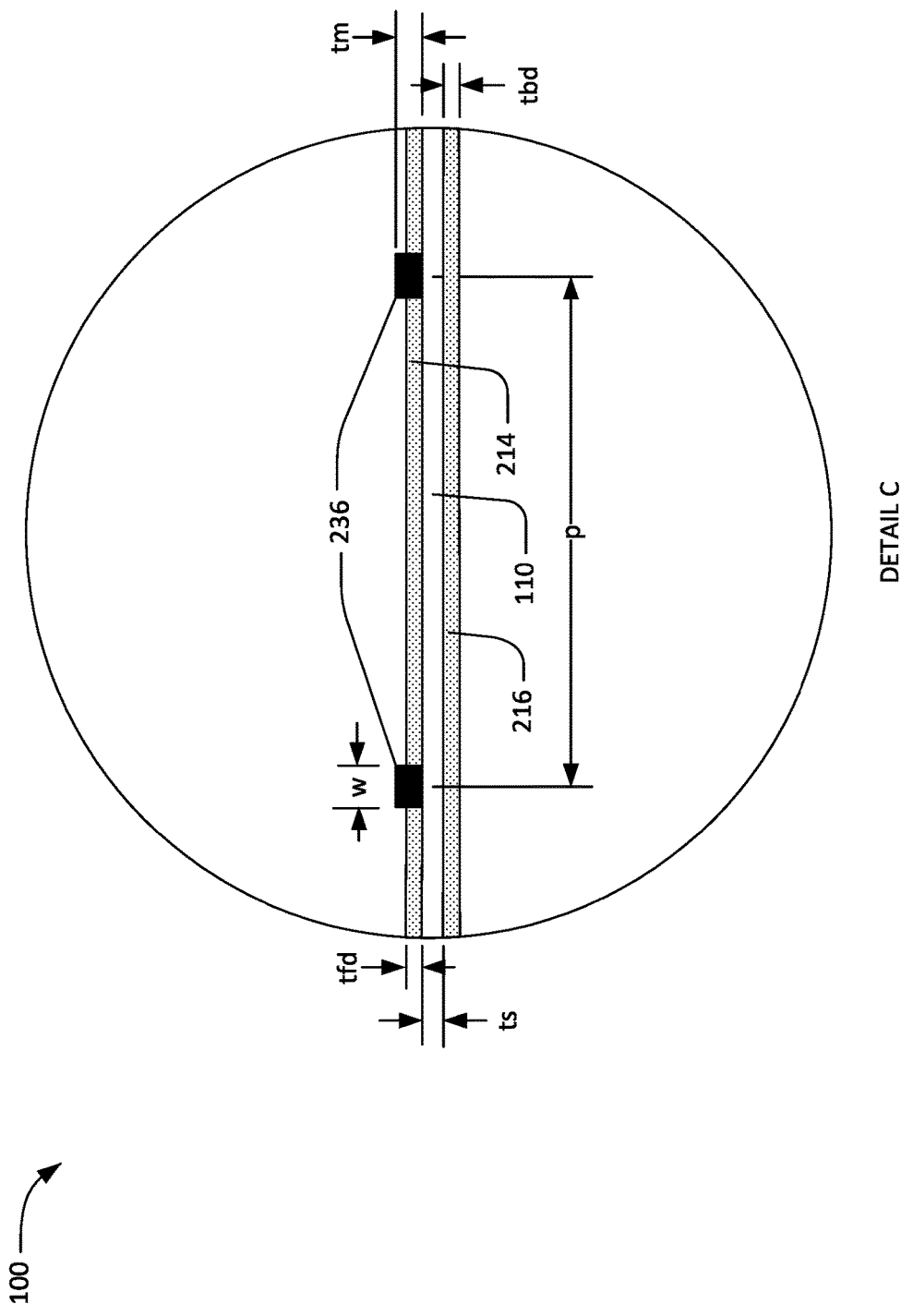
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
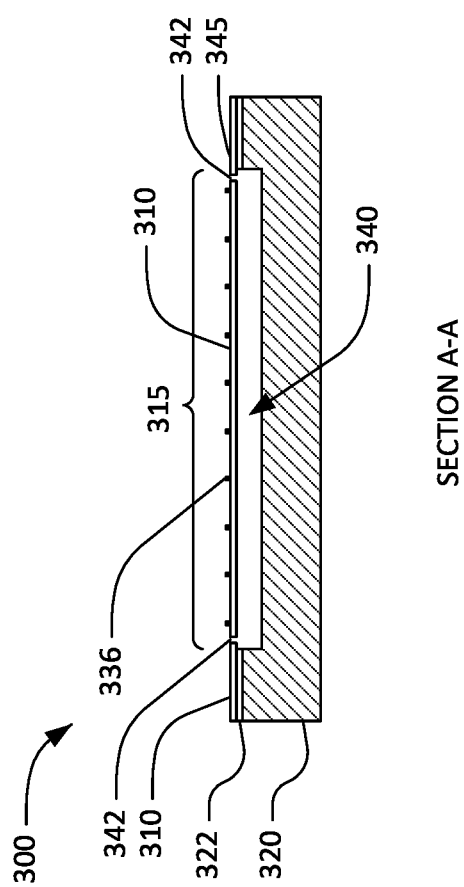
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be or include a bonding layer, a BOX layer, an etch stop layer, a sealing layer, an adhesive layer or layer of other material that is attached or bonded to plate 310 and substrate 320. Layers 322 may be one or more of any of these layers or a combination of these layers.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
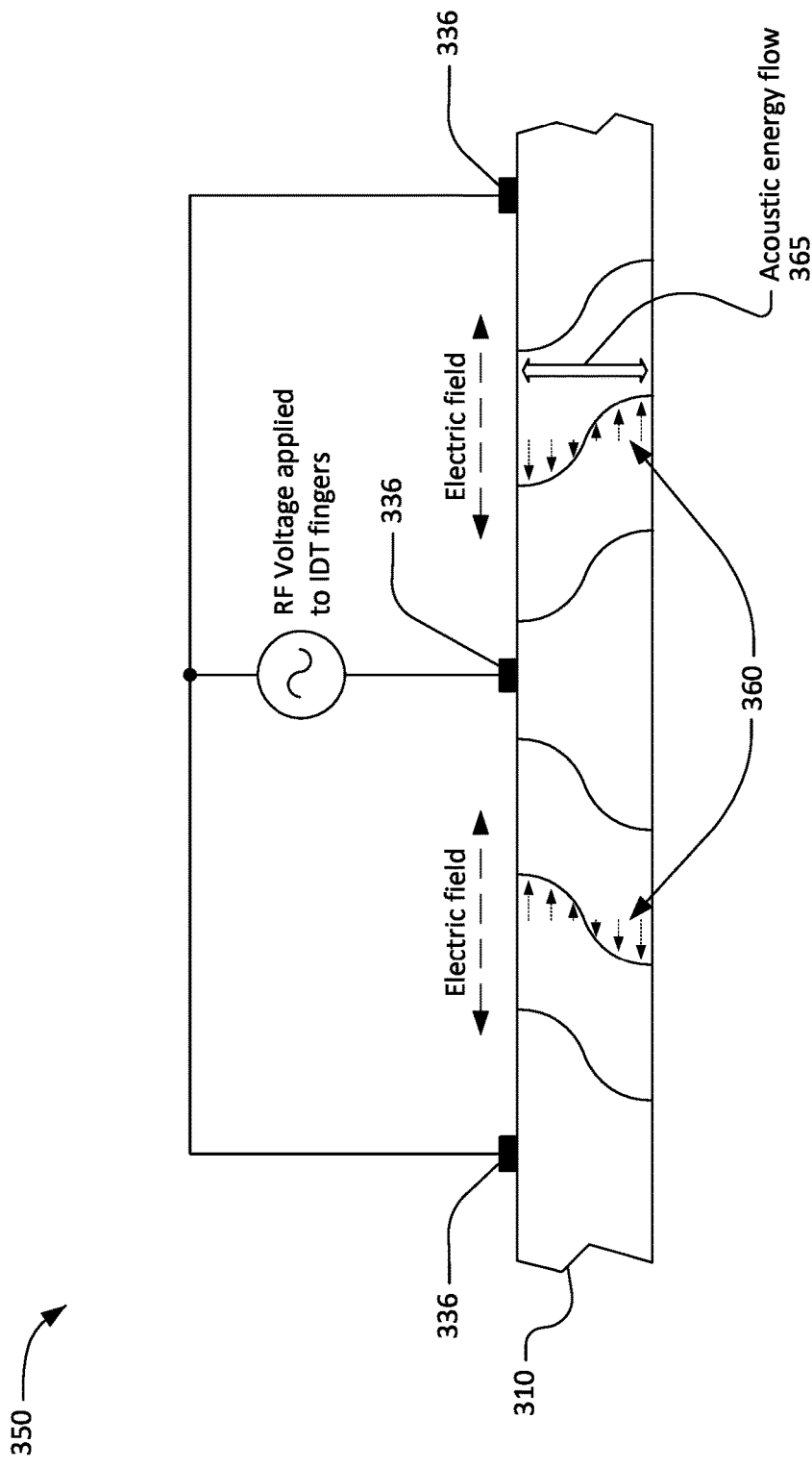
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 3C:
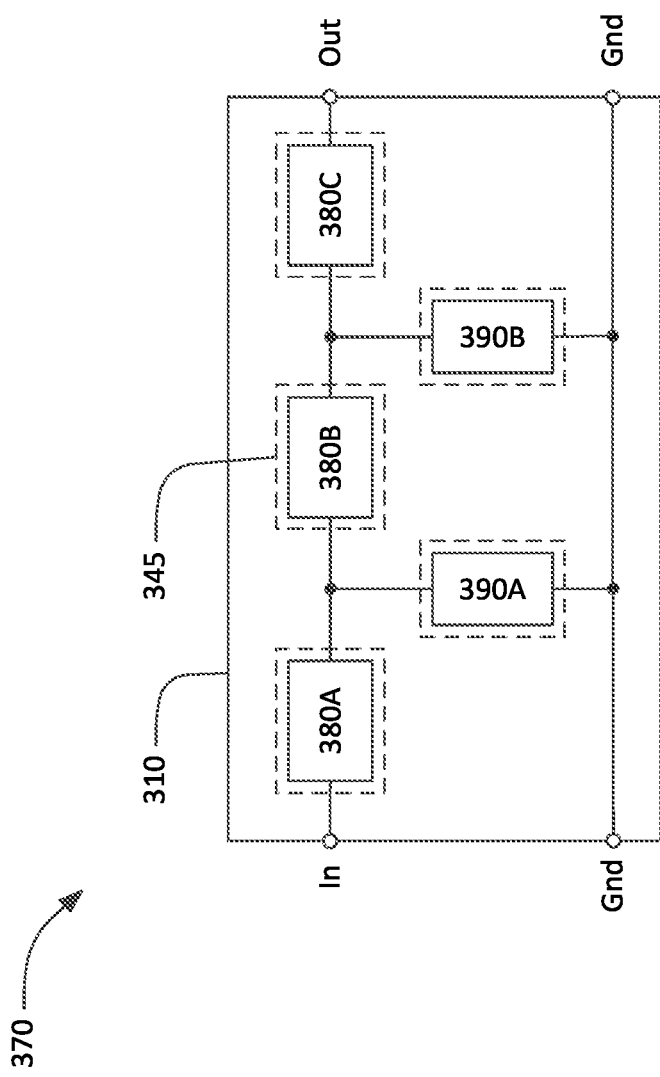
FIG. 3C is a schematic circuit diagram and layout for a high frequency band-pass filter using XBARs.

FIG. 3C is a schematic circuit diagram and layout for a high frequency band-pass filter 370 using XBARs. The filter 370 has a conventional ladder filter architecture including three series resonators 380A, 380B, 380C and two shunt resonators 390A, 390B. The three series resonators 380A, 380B, and 380C are connected in series between a first port and a second port. In FIG. 3C, the first and second ports are labeled "In" and "Out", respectively. However, the filter 370 is bidirectional and either port and serve as the input or output of the filter. The two shunt resonators 390A, 390B are connected from nodes between the series resonators to ground. All the shunt resonators and series resonators are XBARs on a single die.

The three series resonators 380A, B, C and the two shunt resonators 390A, B of the filter 370 are formed on a single plate 310 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 3C, the cavities are illustrated schematically as the dashed rectangles (such as the rectangle 345). In this example, each IDT is disposed over a respective cavity. In other filters, the IDTs of two or more resonators may be disposed over a single cavity.

Description of Methods

Figure 4A:
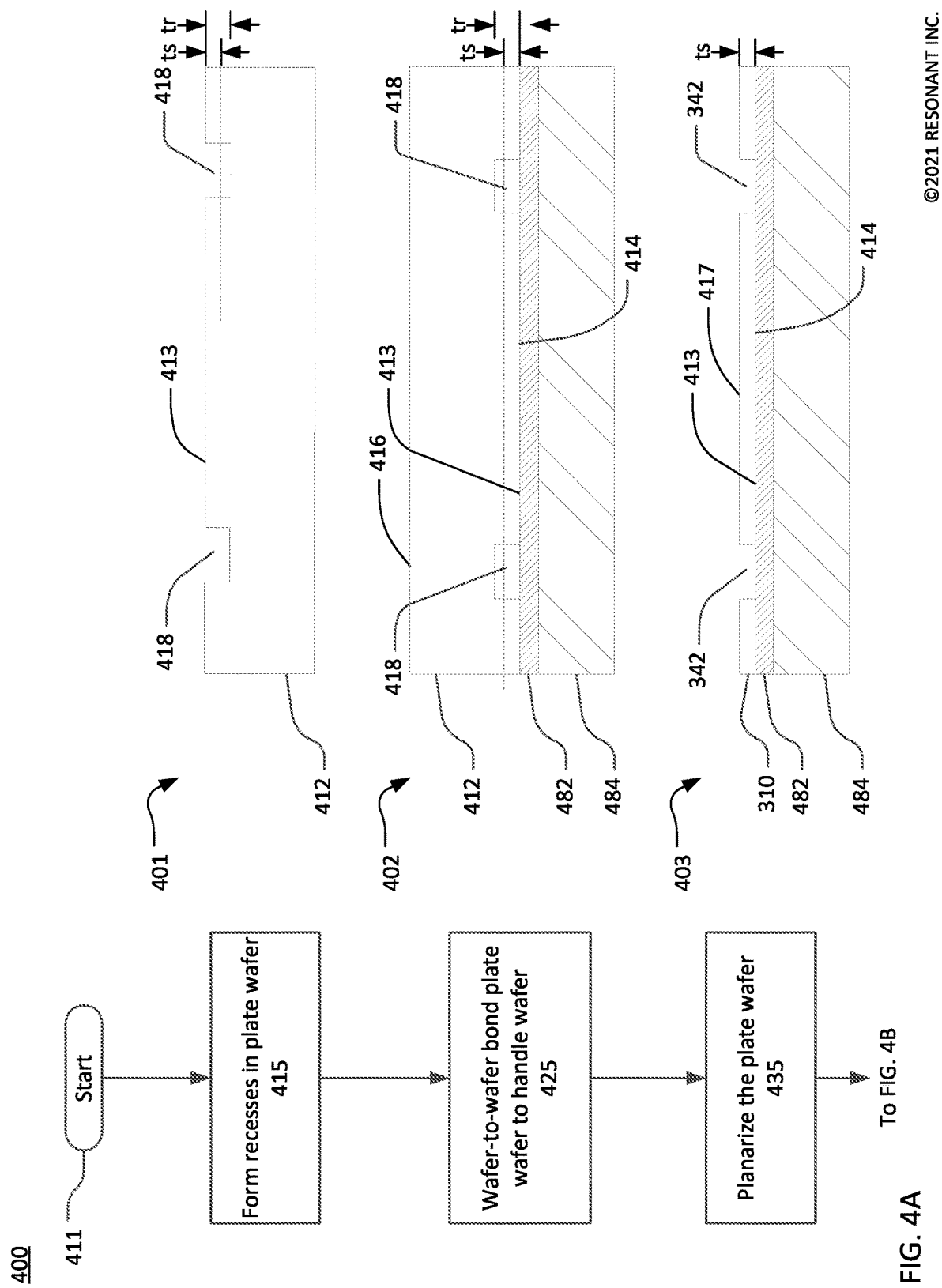
FIGS. 4A, 4B and 4C (collectively "FIG. 4") are a flow chart of a process for fabricating an XBAR using wafer-to-wafer bonding.
Figure 4B:
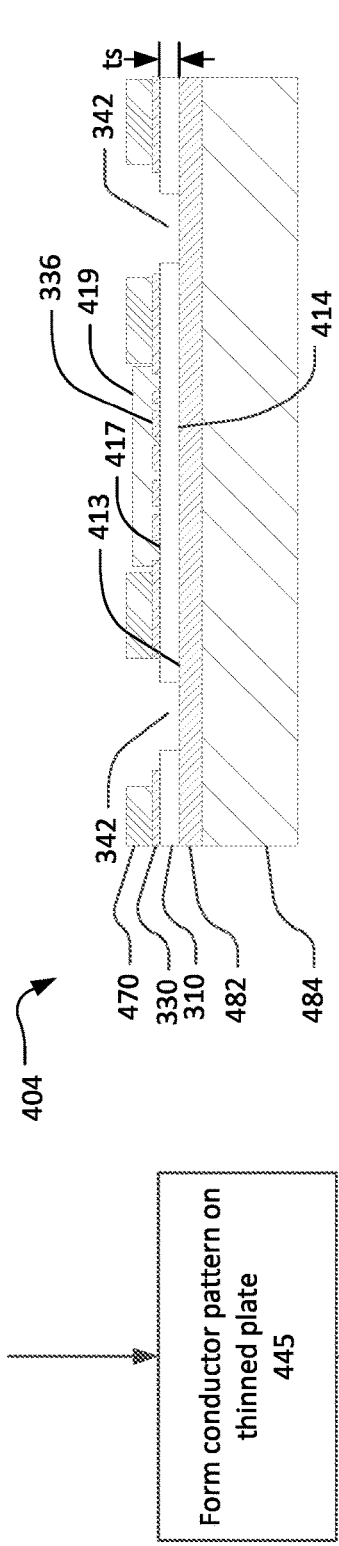
Figure 4B:
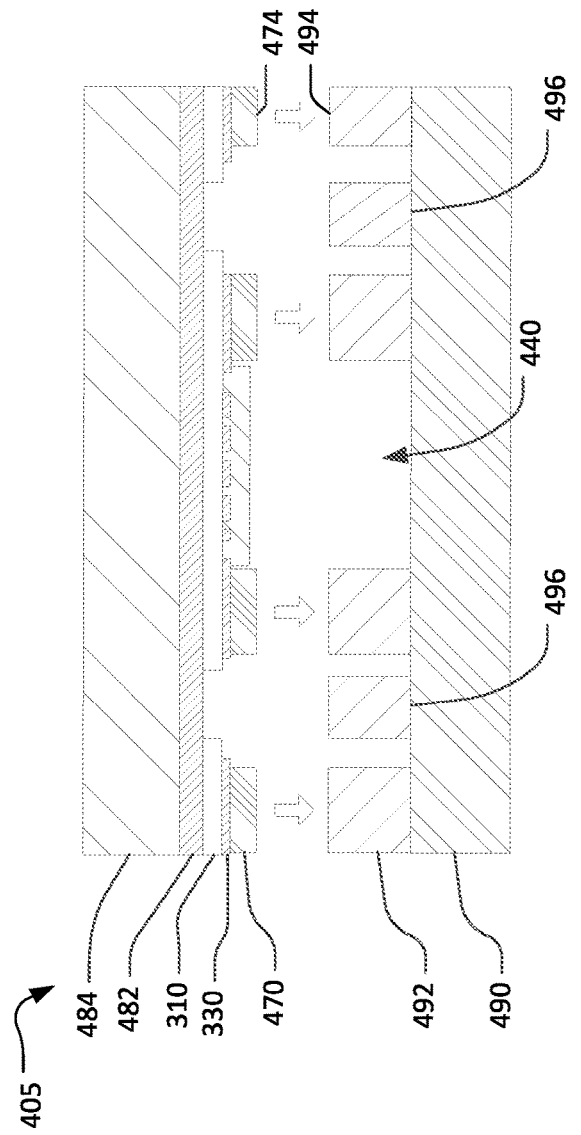
Figure 4C:
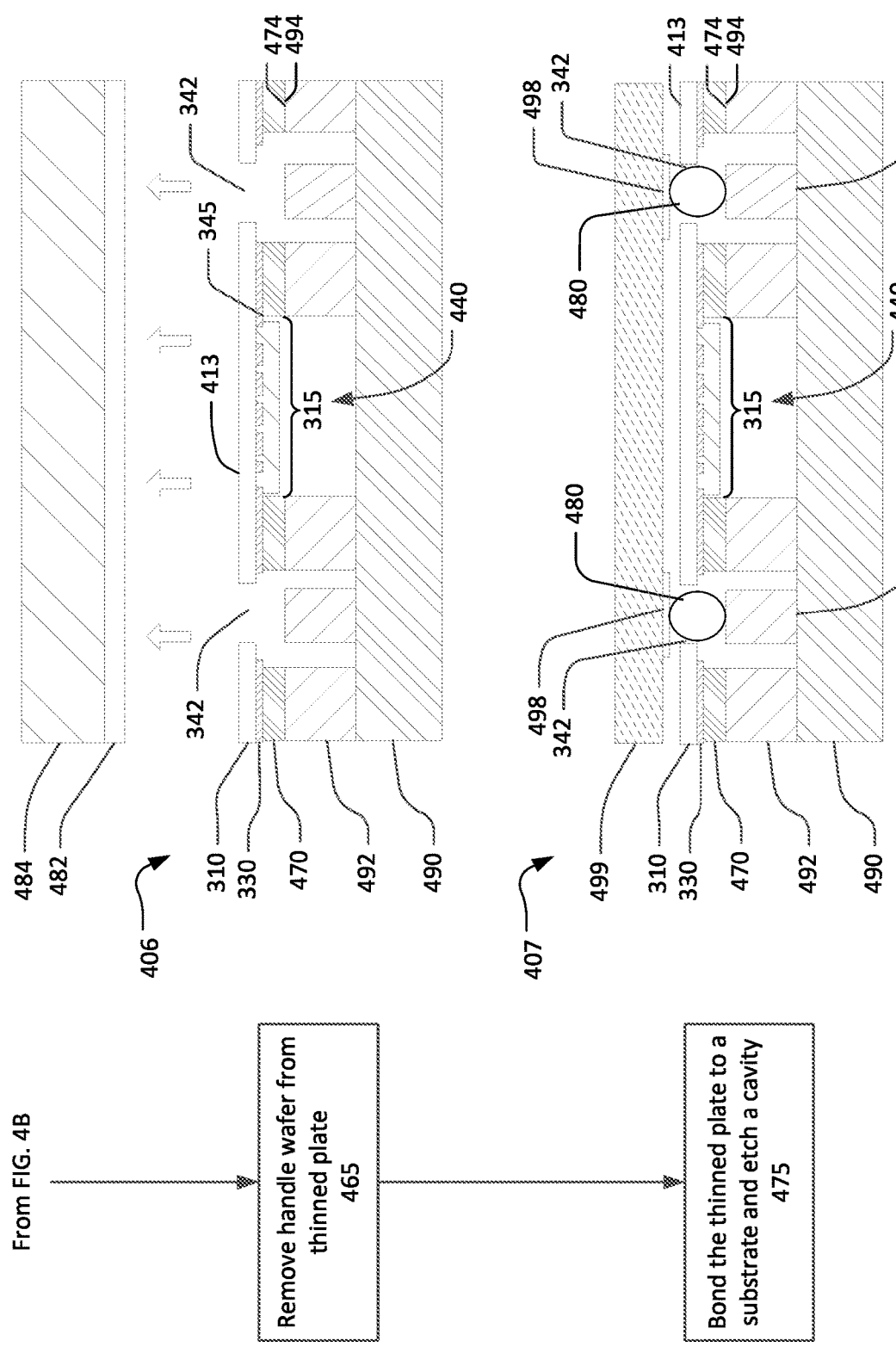

FIGS. 4A, 4B and 4C (collectively "FIG. 4") are a flow chart 400 of a process for fabricating an XBAR or a filter incorporating XBARs using wafer-to-wafer bonding. The process 400 includes mounting and thinning a piezoelectric substrate to form a piezoelectric plate for a wafer-to-wafer bonding process of the plate to a substrate for frontside membrane release of the plate when a cavity is etched in the substrate. It may include an piezoelectric LiNbO3 (LN) substrate thinning method to thin the substrate to form an LN plate for the wafer-to-wafer bonding. The process 400 is or is included in the forming of XBAR 100, 300, 350 and/or of filter 370.

The flow chart of FIG. 4 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 4.

The process 400 starts at 411 with obtaining or receiving a thick piezoelectric substrate, of material noted for plate 110 and/or 310. The process 400 ends at 475 with a completed XBAR or filter 370. The piezoelectric substrate may be, for example, Z-cut, rotated Z-cut, or rotated Y-cut lithium niobate or lithium tantalate. The piezoelectric substrate may be some other material and/or some other cut as previously noted for plate 110. The substrate may be an LiNbO3 (LN) substrate having a thickness between 150 um and 350 um. It may have a thickness of 250 um. At 611, the plate substrate may be received such as by being obtained or purchased from an outside source.

After 411, at 415, recesses 418 are etched into a first surface 413 of the piezoelectric substrate obtained at 411 to a depth tr greater than a target piezoelectric membrane thickness ts to form device 401. Thickness ts may be a target thickness for plate 310 after thinning of piezoelectric substrate 415 at step 435. Depth tr may be between 100 nm and 500 nm. It may be between 250 nm and 300 nm. It may be 275 nm. In some cases, thickness ts is between 100 nm and 1000 nm; depth tr is between 200 nm and 1500 nm; and depth tr is greater than thickness ts.

Recesses 418 are formed in the piezoelectric substrate in the locations where the cavity 140 or 340 is desired to form device 402. Referring to FIG. 3A, the recesses may be locations in the for one or more openings 342 provided in the piezoelectric plate 310 through which the cavity 340 will be formed by etching the substrate 320 with a selective etchant that reaches the substrate through these openings 342. While the recesses 418 are only shown in cross-section in FIG. 4, it must be understood that each recess 418 is a three-dimensional opening created by removing material from the obtained piezoelectric substrate of step 411 to form plate wafer 412 or device 401.

Recess 418 may have a cross-sectional shape (normal to the plane of the drawing) that is a rectangle, a regular or irregular polygon, oval, or some other shape desired for etching through to form cavity 340. The recess 418 may be formed by etching the plate wafer through a suitable mask such as a photoresist mask or a hard mask. The plate may be selectively etched with respect to the mask. The recesses 418 may be etched into the plate wafer using a suitable wet or dry etching process. The recesses may be formed by a timed etch. For example, the recesses may be formed using ion milling. In some cases, the etching may be done by a reactive ion etching (RIE), an inductively coupled plasma (ICP) and/or a laser milling process. Other etching processes may be used on the plate wafer.

At 425, the first surface 413 of the piezoelectric plate wafer 412 is wafer-to-wafer bonded to a handle wafer 484 using a releasable bonding material 482 to form device 402. Here, the recesses are facing the bonding material 482. The piezoelectric plate wafer 412 and the handle wafer 484 may be wafer-to-wafer bonded by a wafer bonding process that uses releasable bonding material 482 having a surface 414 bonded to surface 413 of plate wafer 412. Intervening layers may exist between the releasable bonding material 482 and the handle wafer 484. The mating surface 413 of the piezoelectric plate wafer 412 may be highly polished. In some cases, a range of thickness of handle wafer 484 is a thickness of between 250 um and 1000 um.

The handle wafer 484 may be or include silicon, quartz, glass and/or sapphire. The releasable bonding material 482 may be or include organic adhesives, inorganic adhesives and/or other bonding adhesives. For adhesive bonding, a huge variety of organic adhesives (mainly polymers) with different chemistries and material properties can be used for bonding material 482. For example, 3M® special UV-curable adhesives, epoxies, and/or benzocyclobutene (BCB) can be used as bonding material 482. Inorganic adhesives that can be used as bonding material 482 are mostly ceramic materials that are based on oxides or silicates. The bonding material 482 can also be a bi-layer system comprised of a laser-releasable layer (LRL) and an adhesive. The bonding process at 425 may include fusion bonding, anodic bonding, surface-activated bonding, metal layer bonding, thermocompression bonding, and insulating interlayer adhesive and glass frit bonding.

At 435, the piezoelectric plate 412 is thinned on the side or surface 416 away from the handle wafer 484 until the plate 412 is the target piezoelectric membrane thickness ts, to form device 403. Thus, plate 412 becomes plate 310 having surface 417; and the recesses 418 extend completely through the thickness ts of the plate 310 to create holes or openings 342. Planarizing the plate 412 may include thinning the plate by ion slicing, chemical mechanical polishing (CMP) or some other method to polish the plate to a desired thickness ts.

Thinning at 435 may include grinding and polishing the plate to target thickness ts where RA<1 nm, and TTV+/−10 nm, where RA is the Roughness Average of a surface's measured microscopic peaks and valleys and TTV is the Total Thickness Variation across the wafer. The recesses 418 and/or openings 342 will allow interconnection of the IDT (e.g., busbars) of layer 330 to the gold pads of an M2 metal layer 470 for electrical contacts on the carrier wafer for the wafer-to-wafer bonding structures, such as at 455. The recesses 418 and/or openings 342 can also be used for frontside etching through to form the cavity 340 under the membrane or plate 310. For frontside cavity etching, the openings 342 can be used as access points for the etchant, such as to layer 490.

At 445, a conductor pattern is formed on surface 417 of the thinned piezoelectric plate 310 that is away from the handle wafer 484 to form device 404. The conductor pattern includes an IDT 130 having interleaved fingers 336. The conductor pattern may be an M1 metal layer.

A mask may be patterned onto the top surface 417 of plate 310 to form the IDT 130. Forming IDT may include forming conductor patterns and dielectric layers defining one or more XBAR devices on the surface of the piezoelectric plate 310. Typically, a filter device will have an IDT as a first of two or more conductor layers that are sequentially deposited and patterned. The IDT layers may be, for example, aluminum, an aluminum alloy, copper, a copper alloy, molybdenum, tungsten, beryllium, gold, or some other conductive metal. Optionally, one or more layers of other materials may be disposed below (i.e. between the IDT layer and the piezoelectric plate) and/or on top of the IDT. For example, a thin film of titanium, chrome, or other metal may be used to improve the adhesion between the IDT layer and the piezoelectric plate.

The IDT 130 may be formed by depositing the conductor layers over the surface 417 of the piezoelectric plate 310 and removing excess metal by etching through a patterned photoresist that covers areas of the IDT. Alternatively, the IDT may be formed using a lift-off process. Photoresist may be deposited over the piezoelectric plate and patterned to remove areas that leave behind or define the IDT. The IDT material may be deposited in sequence over the surface of the photoresist and piezoelectric plate. The photoresist may then be removed, which removes the excess material, leaving the IDT.

Also, at 445, a second M2 metal layer 470 may be formed on the conductor pattern and/or a passivation layer 419 may be formed on part of the conductor pattern, such as over the diaphragm 315 to be formed later.

Second M2 metal layer 470 is electrically conductive material attached to the top of the M1 layers or IDT, such as to the top of the busbars and not to the top of the fingers 336. In some cases, the second metal layers 470 are multiple conductive layers formed similar to forming the IDT 130.

Layer 470 may include contact pads for connecting to contact bumps. The contact pads may be for electrically contacting contact bumps that are bonding pads, gold or solder bumps, or other means for making connection between the device 404 (e.g., contact pads, conductor layers or busbars) and carrier wafer 490 at step 455; and/or between device 404 and a package, PCB and/or external circuitry, at step 475.

The material of layer M1 and layer M2 may be a metal or conductor as described for IDT 130. They may be the same material. They may be a different material. They may be formed during one or more different processing steps. These steps may be different than steps for forming the IDT.

Forming passivation layer 419 may include forming one or more dielectric layers on the plate and/or IDT, such as a front side dielectric and/or a passivation layer as noted herein. The passivation layer 419 may include, for example, a dielectric layer selectively formed over the IDTs of shunt resonators to shift the resonance frequency of the shunt resonators relative to the resonance frequency of series resonators as described in U.S. Pat. No. 10,491,192. The different thickness of the dielectric layer may cause the XBAR to be tuned to a selected frequency as compared to the other XBARs. For example, the resonance frequencies of the XBARs in a filter may be tuned using different front-side dielectric layer thickness on some XBARs as compared to others. The passivation layer 419 may include an encapsulation/passivation layer deposited over all or a membrane area of the device. Forming passivation layer 419 may include, for example, depositing an encapsulation/passivation layer such as $SiO_2$ or $Si_3N_4$ over a portion of the device 403.

Forming the M1, M2 and passivation layer may each include patterning and fabricating those layers separately. In some cases, the plate 310 is Lithium Niobate (LN) which may be 275 nm thick; the passivation layer 419 is SiO2; the M1 or IDT is Aluminum (Al) metal traces; and the M2 is Gold (Au) contact pads and traces.

At 455, the side of the plate 310 having the conductor pattern and IDT 130 is wafer-to-wafer bonded to a carrier wafer 490 using a metal-to-metal wafer bonding process to form device 405. At 455, top surfaces 474 of M2 layer 470 are metal-to-metal bonded to top surfaces 494 of metal layer 492 of carrier wafer 490. Surfaces 474 and 494 may be polished or otherwise treated conductor or metal surfaces of an integrated circuit (IC) chip or transistor (e.g., a field electric transistor—FET). Metal layer 492 includes contact pads 496 for connecting to contact bumps. The contact pads may be for electrically contacting contact bumps that are bonding pads, gold or solder bumps, or other means for making connection between the device 405 (e.g., contact pads, conductor layers or busbars) and a package, PCB and/or external circuitry, at step 475.

Carrier wafer 490 may be or include a material as noted for handle wafer 484. Carrier wafer 490 may be a silicon carrier wafer with patterned structures 492. It may be a printed circuit board (PCB) and/or a package for the XBAR or device 404. It may be: 1) mounted above and onto the top surfaces 474 of the M2 layer 470; and/or 2) mounted using contact bumps bonded between surfaces 494 of wafer 490 and surfaces 474 of M2 layer 470. In some cases, it is only mounted using 1) or 2) above. Wafer 490 may be or contain a printed circuit board (PCB) that includes metal traces. It may be formed by high-temperature co-fired ceramics (HTCC) with signal routing (e.g., vias, traces and contact pads). In some cases, the package is a PCB laminate with copper (Cu) signal routing. It may be formed by known PCB processes and have known signal routing.

The metal-to-metal bonding may be done by chemical, atomic and/or adhesive bonding. It may be attaching surfaces 474 and 494 by being chemically or adhesively bonded to each other; or by being chemically and/or thermally treated at those surfaces to cause them to bond. Thermal annealing may be involved. The bonding process at 455 may include eutectic bonding, solder bonding, and/or thermocompression bonding.

Bonding at 455 forms air cavity 440 between the plate 310 and the carrier wafer 490 as also shown as step 465. Cavity 440 is formed such that a diaphragm 315 of the piezoelectric plate 310 containing the IDT 330 is suspended over the cavity 440 without contacting the wafer 490 or the bottom of the cavity.

At 465, the handle wafer 484 is removed from the plate 310 by removing the releasable bonding material 482 to form device 406. Removing the handle wafer releases plate 310 from wafer 484 and forms diaphragm 315 over cavity 440. Device 406 may represent device 100, 200 and/or 300. Cavity 440 may have a shape and depth as noted for cavity 140 or 340 FIGS. 1-3. The diaphragm 315 may be contiguous with the rest of the piezoelectric plate 310 around a large portion of a perimeter 345 of the cavity 440. A separate cavity may be formed for each resonator in a filter device. Typically, the cavities 440 formed at 455 may not penetrate through wafer 490, and the resulting resonator devices will have a cross-section as shown at step 465.

The releasable bonding material 482 may be removed, for example, by material-dependent wet or dry etching or some other process. The dependent etch may be selective to the plate 310, conductor layer or IDT 130; M2 layer 270 layer 492 and wafer 490 while etching material 482. The etch may or may not etch handle wafer 484 while removing layer 482. In some cases, the etch may simply be a wash that cleans material 482 from the surfaces of wafer 414 and plate 310 without removing any of the other components or layers of device 405. In cases where the bonding material is a bi-layer system comprised of a laser-releasable layer (LRL) and an adhesive; a laser can be used to release the LRL attached to the handle wafer, followed by a subsequent rinse of the adhesive layer.

The filter or XBAR device 406 may be completed at 465. Actions that may occur at 465 include excising individual devices from a wafer containing multiple devices; other packaging steps; and testing. Another action that may occur at 465 is to tune the resonant frequencies of the resonators within a filter device.

At 475, contact bumps 480 are connected between top surfaces of contact pads 496 and contacts pads 498 of capping layer 499 to form device 407. At 475, device 406 may have gold stud bumps 480 attached to pads 496 then be flip-chipped bonded to a PCB or ceramic substrate 499, then a standard overmolding process (not shown) may be used to encapsulate the device 407. Contact bumps 480 may be first formed on pads 496 then bonded to pads 498; or vice versa. The contact bumps electrically connect pads 496 to pads 498. The contact bumps 480 are bonding pads, gold or solder bumps, and/or other means for making electrical connections.

Capping layer 499 may be or include a material as noted for handle wafer 484. Capping layer 499 may be a silicon carrier wafer with patterned structures including contacts 498. It may be a printed circuit board (PCB) and/or a package for the XBAR or device 406. It may be: 1) mounted above and onto the top surfaces 413 of device 406; and/or 2) mounted using contact bumps 480 bonded between the pads 496 and 498. Capping layer 499 may be or contain a printed circuit board (PCB) that includes metal traces. It may be formed by high-temperature co-fired ceramics (HTCC) with signal routing (e.g., vias, traces and contact pads). In some cases, the package is a PCB laminate with copper (Cu) signal routing. It may be formed by known PCB processes and have known signal routing. Capping layer 499 may be or include a protective encapsulating layer for the device 406.

Connecting contact bumps 480 may be metal-to-metal bonding done by chemical, atomic and/or adhesive bonding. It may be thermally treating the metal surfaces of the bumps and pads to cause them to bond. Thermal annealing may be involved. The bonding process at 475 may include eutectic bonding, solder bonding, and/or thermocompression bonding.

Electrical connections may be made between the filter device 406 and external devices through vias though the carrier wafer 490 that are connected between the contact pads 496 and parts of layer 492 that are connected to layer 470. Vias through the backside of the carrier wafer 490 are also possible to connect between the contact pads on the back of wafer 490 and parts of layer 492 that are connected to layer 470.

The frequency of the filter device 406 may be trimmed by electrically testing the filter (using the vias in the carrier wafer 490) prior to step 475 and then tuning device 406 by selectively adding or removing material from the exposed surface of the thinned plate 310. Trimming can be done on the backside surface of the thinned plate 310 of device 406. After filter electrical testing, the LN thinned plate 310 can be ion trimmed on its back surface 413 to reduce thickness to increase filter frequency. If the filter frequency is high, then a thin layer of $SiO_2$ or $Si_3N_4$ can be deposited on surface 413 to reduce frequency.

Thus, process 400 forms improved XBAR resonators or filters using fabrication techniques having the wafer-to-wafer bonding process of steps 425 and 455 (and optionally 475), such as by mounting and thinning a piezoelectric substrate of a plate wafer 484 for the wafer-to-wafer bonding process. This process may have advantages of a frontside membrane release of the plate 310 from a substrate 320 when forming a cavity 340 under the plate.

Problems solved by process 400 use a wafer-to-wafer bonding process to provide a lower cost, more controllable approach for forming XBAR devices as compared to a backside membrane release (BSMR) process. The described piezoelectric substrate thinning method of process 400 will enable frontside device fabrication on thin piezoelectric plates at 445 prior to wafer-to-wafer bonding at 455. For instance, a BSMR method may use a deep reactive ion etching technique to remove the Si substrate 120 underneath the piezoelectric plate 110 and the etching time increases with Si substrate thickness. The FSMR of process 400 eliminates the BSMR etch processing which eliminates taking more etching chemistry, etchant and/or time of the BSMR.

It is also noted that other FSMR techniques on pre-patterned Si substrates utilize air cavities below and require frontside device fabrication on thin piezoelectric plates which poses a high risk due to the fragility of the thin plate because the frontside processing can crack and/or damage the thin plate. The process 400 uses a piezoelectric substrate thinning approach at step 435 that mitigates this cracking risk by providing an underlying support structure of handle wafer 484 for the piezoelectric plate during the device processing as shown. Thus, the frontside processing to form conductor layers and dielectric layers at 445 will not crack and/or damage the thin plate 310 because the handle wafer 484 will support the plate 310, instead of the plate being suspended over air or a layer that is not a thick handle wafer.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method comprising:
   etching recesses into a first surface of a piezoelectric substrate, a depth of the recesses greater than a target piezoelectric membrane thickness;
   bonding the first surface of the piezoelectric substrate to a handle wafer using a releasable bonding method;
   thinning the piezoelectric substrate to the target piezoelectric membrane thickness to form a piezoelectric plate, the thinning of the piezoelectric substrate including forming openings extending through the thinned piezoelectric plate and to the handle wafer;
   forming at least one conductor pattern on the thinned piezoelectric plate;
   bonding a side of the thinned piezoelectric plate having the conductor pattern to a carrier wafer using a metal-to-metal wafer bonding process;
   removing the handle wafer; and
   after the handle wafer is removed, bonding contact pads of the carrier wafer to contact pads of a capping layer through the openings.

2. The method of claim 1, wherein the forming of the at least one conductor pattern comprises forming an interdigital transducer (IDT) with interleaved fingers disposed on a location for a diaphragm to be formed over a cavity.

3. The method of claim 2, wherein the bonding of the side of the thinned piezoelectric plate comprises forming the cavity under the thinned plate below the location for the diaphragm.

4. The method of claim 2, wherein the forming of the at least one conductor pattern comprises forming a passivation layer over the interleaved fingers of the conductor pattern.

5. The method of claim 2, wherein:
   the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate.

6. The method of claim 1, wherein the bonding of the side of the thinned piezoelectric plate comprises bonding a metal layer of the carrier wafer to a metal layer of the conductor pattern.

7. The method of claim 1, wherein the etching of the recesses into the first surface of a piezoelectric substrate includes:
   patterning the first surface of piezoelectric substrate; and
   etching the patterned piezoelectric substrate to remove areas of the piezoelectric substrate to create openings for contact bumps.

8. The method of claim 1, wherein a thickness of the thinned plate ts is between 100 nm and 1000 nm; a depth of the recesses tr is between 200 nm and 1500 nm; and the depth tr is greater than the thickness ts.

9. A method for fabricating an acoustic resonator comprising:
   etching recesses into a first surface of a piezoelectric substrate, a depth of the recesses greater than a target thickness of a piezoelectric plate;
   bonding the first surface of the piezoelectric substrate to a handle wafer using a releasable bond;
   thinning the first surface of the piezoelectric substrate to thin the piezoelectric substrate to the target thickness to form the piezoelectric plate, the thinning of the piezoelectric substrate including forming openings extending through the thinned piezoelectric plate and to the handle wafer;
   forming a first conductor pattern on the thinned first surface of the piezoelectric plate;
   forming a second conductor pattern on the first conductor pattern;
   bonding the second conductor pattern to a conductor pattern of a carrier wafer using a metal-to-metal wafer bonding process and so that the first conductor pattern is on a surface of the piezoelectric plate that is facing the carrier wafer;
   removing the handle wafer; and
   after the handle wafer is removed, bonding contact pads of the carrier wafer to contact pads of a capping layer through the openings.

10. The method of claim 9, wherein the forming of the first conductor pattern comprises forming an interdigital transducer (IDT) with interleaved fingers disposed on a location for a diaphragm to be formed over a cavity; and wherein the forming of the second conductor pattern comprises forming contact pads on the first conductor pattern.

11. The method of claim 10, wherein the bonding of the second conductor pattern to the conductor pattern of the carrier wafer forms the cavity under the piezoelectric plate below the location for the diaphragm.

12. The method of claim 10, wherein:
   the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate.

13. A method for forming an acoustic resonator comprising:
   etching at least one recess into a first surface of a piezoelectric substrate, a depth of the at least one recess greater than a target piezoelectric membrane thickness;
   bonding the first surface of the piezoelectric substrate to a handle wafer using a releasable bonding method;
   thinning the piezoelectric substrate to the target piezoelectric membrane thickness to form a piezoelectric plate and to form at least one opening through the plate and to the handle wafer at the at least one recess;
   forming at least two conductor patterns on the thinned piezoelectric plate, wherein forming the at least two conductor patterns comprises forming an interdigital transducer (IDT) with interleaved fingers disposed on a location for a diaphragm to be formed over a cavity;

bonding the at least two conductor patterns to a metal layer of a carrier wafer using a metal-to-metal wafer bonding process;

removing the handle wafer; and after the handle wafer is removed, bonding at least one contact pad of the carrier wafer to at least one contact pad of a capping layer through the at least one opening.

14. The method of claim 13, wherein the bonding of the at least two conductor patterns to the metal layer of the carrier wafer comprises forming the cavity between the diaphragm, the metal layer of the carrier wafer and a surface of the carrier wafer.

15. The method of claim 13, wherein the forming of the at least two conductor patterns comprises forming a first conductor pattern including the IDT and forming a second conductor pattern on part of the first conductor pattern; and wherein the bonding of the at least two conductor patterns to the metal layer of the carrier wafer includes bonding the second conductor pattern to the metal layer of the carrier wafer using the metal-to-metal wafer bonding process.

16. The method of claim 13, wherein:

the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate.

* * * * *